United States Patent [19]
Wells et al.

[11] Patent Number: 5,131,968
[45] Date of Patent: Jul. 21, 1992

[54] GRADIENT CHUCK METHOD FOR WAFER BONDING EMPLOYING A CONVEX PRESSURE

[75] Inventors: Raymond C. Wells; Frank S. d'Aragona, both of Scottsdale, Ariz.

[73] Assignee: Motorola, Inc., Schaumburg, Ill.

[21] Appl. No.: 565,761

[22] Filed: Jul. 31, 1990

[51] Int. Cl.⁵ .................... B32B 31/16; H01L 21/304
[52] U.S. Cl. ........................... 156/153; 156/87; 156/281; 156/285; 148/DIG. 135; 437/225; 437/974
[58] Field of Search ............... 156/153, 281, 212, 87, 156/285, 286; 279/3; 437/62, 225, 921, 974; 148/DIG. 12, DIG. 159, DIG. 135; 51/283 R

[56] References Cited

U.S. PATENT DOCUMENTS

| | | | |
|---|---|---|---|
| 3,098,272 | 7/1963 | Frye | 156/289 |
| 3,322,598 | 5/1967 | Marks et al. | 156/212 |
| 3,955,163 | 5/1976 | Novak | 279/3 X |
| 4,152,188 | 5/1979 | Friedrich et al. | 156/212 |
| 4,564,408 | 1/1986 | Crumbach et al. | 156/581 X |
| 4,603,867 | 8/1986 | Babb et al. | 279/3 |
| 4,671,846 | 6/1987 | Shimbo et al. | 156/153 |
| 4,774,196 | 9/1988 | Blanchard | 148/DIG. 135 X |
| 4,810,318 | 3/1989 | Haisma et al. | 156/281 X |
| 4,818,323 | 4/1989 | d'Aragona et al. | 437/225 X |
| 4,854,986 | 8/1989 | Raby | 156/87 |
| 4,883,215 | 11/1989 | Goesele et al. | 156/281 X |
| 4,927,479 | 5/1990 | Böch | 156/228 |
| 4,927,480 | 5/1990 | Vaughan | 156/228 |
| 4,939,101 | 7/1990 | Black et al. | 148/DIG. 12 X |
| 4,983,251 | 1/1991 | Haisma et al. | 148/DIG. 12 X |

FOREIGN PATENT DOCUMENTS

| | | |
|---|---|---|
| 62-71215 | 4/1987 | Japan . |
| 575923 | 3/1946 | United Kingdom ............... 279/3 |

OTHER PUBLICATIONS

Lehman, V. et al., "Contamination Protection of Semiconductor Surfaces by Wafer Bonding," Solid State Technology, Apr. 1, 1990, pp. 91-92.

Haisma, J. et al., "Silicon-on-Insulator Wafer Bonding-Wafer Thinning Technological Evaluations", *Japanese Journal of Applied Physics*, vol. 28, No. 8, Aug. 1989 pp. 1427-1443.

Shimbo, M. et al., "Silicon-to-Silicon Direct Bonding Method" *Journal of Applied Physics*, vol. 60, No. 8, Oct. 15, 1986, pp. 2987-2989.

Black, R. D. et al., "Silicon and Silicon dioxide thermal bonding for silicon-insulator applications", *Journal of Applied Physics*, vol. 63, No. 8, Apr. 15, 1988, pp. 2773 to 2777.

Lasky, J. B. "Wafer Bonding for Silicon-on-Insulator Technologies", *Applied Physics Letters*, vol. 48, No. 1, Jan. 6, 1986, pp. 78-80.

*Primary Examiner*—Jeff H. Aftergut
*Attorney, Agent, or Firm*—Joe E. Barbee

[57] ABSTRACT

An apparatus and method for improved wafer bonding by scrubbing, spin drying, aligning, and pressing the polished wafers together. The first wafer (13) is mounted on a flat wafer chuck (11) and a second wafer (14) is mounted on a convex pressure gradient chuck (10). Wafers are scrubbed until a polished contamination free surface is obtained and pressed together. The convex pressure gradient chuck exerts a higher pressure at the center of the wafer than at the periphery of the wafer.

6 Claims, 2 Drawing Sheets

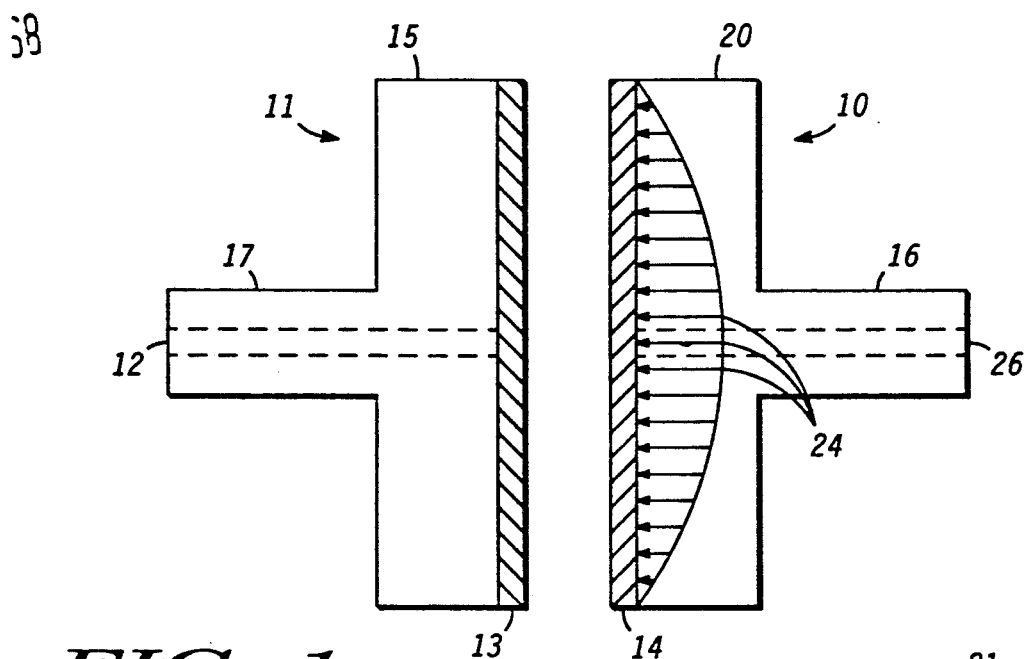
FIG. 1
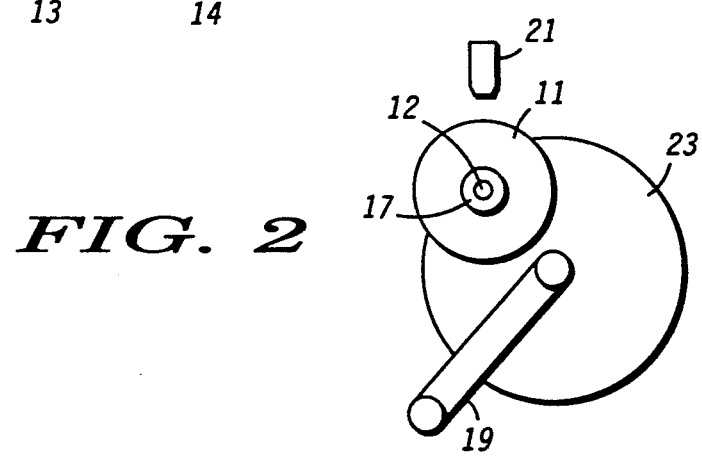
FIG. 2
FIG. 3
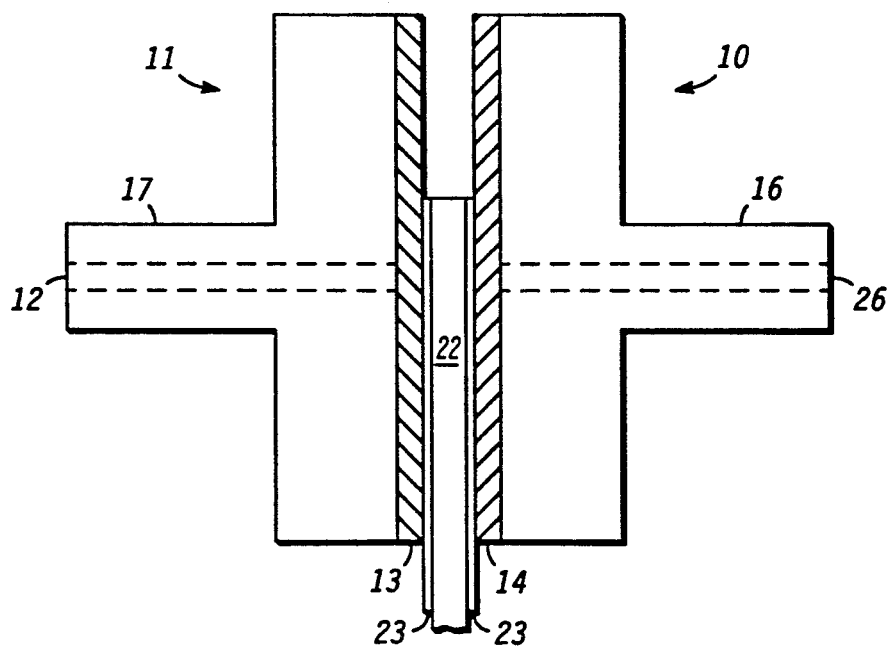

GRADIENT CHUCK METHOD FOR WAFER BONDING EMPLOYING A CONVEX PRESSURE

BACKGROUND OF THE INVENTION

This invention relates, in general, to the bonding of two surfaces, and more particularly, to an apparatus and method for bonding two semiconductor wafers.

The bonding of two semiconductor wafers together offers many advantages in the manufacturing of semiconductor devices. Devices that are manufactured in this manner offer higher performance for high density CMOS, high voltage, and high frequency devices. Many theories have been discussed in the literature about actual bonding mechanisms for joining two wafers together. One such theory is Van der Waals bonding or dipole bonding. Van der Waals bonding is caused by an electrical interaction of dipoles in two bodies. This theory as well as others are discussed in greater detail by J. Haisma, G. A. C. M. Spierings, U. K. P. Biermann and J. A. Pals, "Silicon-on-Insulator Wafer Bonding-Wafer Thinning Technological Evaluations," Japanese Journal of Applied Physics, Vol. 28, No. 8, August, 1989, pages 1426-1443. Generally, the conventional process of wafer bonding is achieved by quickly cleaning the surfaces to be bonded, manually placing the surfaces in contact with each other, and further pressing the surfaces together by a hand rolling pin device. This process results in poor bonding and many voids due to contamination.

Contamination of the bonding surface is a major concern in being able to achieve void free bonding of the two surfaces. Organic film and particle contamination are two main contamination types that prevent manufacturing high quality void free bonded surfaces. Organic contamination of semiconductor surfaces has been shown to occur by simple storage of surfaces as described by V. Lehmann, U. Gosele, and K. Mitani, "Contamination Protection of Semiconductor Surfaces by Wafer Bonding," Solid State Technology, April 1990, pages 91-92. Particles, another form of contamination that is well known in the industry also has been shown to participate in the void formation of bonded surfaces. Therefore, a method that enables the removal of contamination and prevents the occurrence of recontamination of the bonding surfaces is highly desirable.

SUMMARY OF THE INVENTION

The objects and advantages of the present invention are provided by an improved apparatus and method for bonding a first and a second wafer together. The first wafer is mounted on a flat chuck, and the second wafer is mounted on a convex pressure gradient chuck. Wafers that are mounted on the flat and convex pressure gradient chucks are scrubbed or polished until a contamination free surface is achieved on both wafers. After the wafers have been scrubbed clean of contamination and before recontamination of the surfaces can occur the wafers are joined. The joining of the wafers is accomplished by moving the chucks together. The convex pressure gradient chuck applies a pressure gradient to the wafer surfaces, further pressing the surfaces together and exerting a higher pressure in the central portion of the wafer than at the peripheral portion to prevent self sealed bubbles or voids.

BRIEF DESCRIPTION OF THE DRAWINGS

FIG. 1 is a cross-sectional view of wafers mounted on chucks;

FIG. 2 pictorially illustrates a chuck mounted with a wafer being scrubbed/polished in accordance with an embodiment of the present invention;

FIG. 3 is a cross-sectional view showing contact of the wafers up against a scrubbing pad.

DETAILED DESCRIPTION OF THE DRAWINGS

Figure 4:
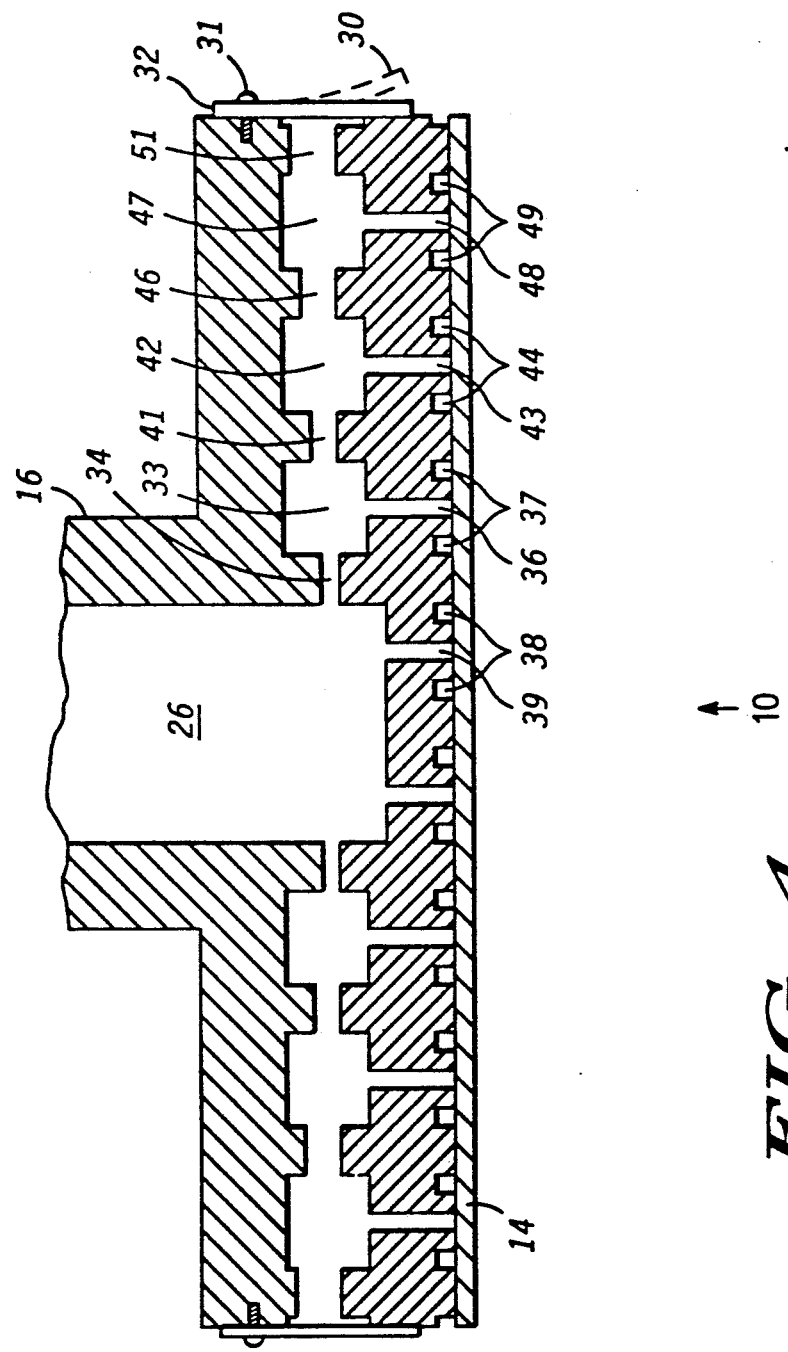
FIG. 4 is a cross-sectional view of convex pressure gradient chuck.

A cross-sectional side view of a flat wafer vacuum chuck 11 and a convex pressure gradient wafer chuck 10 is illustrated in FIG. 1. Flat wafer chuck 11 is illustrated as having a large circular head 15 and a vacuum shaft 17. Wafer 13 is mounted on head 15. Vacuum shaft 17 extends from the middle of vacuum head 15 of flat vacuum chuck 11. Vacuum shaft 17 further contains a vacuum port 12 which extends though shaft 17 and head 15. It should be understood that vacuum shaft 17 is connected to a rotational means which can rotate head 11 and wafer 13 at high RPM. Vacuum port 12 transfers a negative pressure to wafer 13 which holds wafer 13 in place for subsequent processing. Additionally, it should be further understood that chuck 11 is attached to an apparatus that possesses freedom of movement so that direction, speed, and force can be specified.

Chuck 10 is composed of a large circular head 20 and vacuum shaft 16. Circular head 20 is manufactured so that convex pressure gradient 24 is transferred from circular head 20 to wafer 14. Physical properties of head 20 can range from a hard flat surface to a soft malleable or flexible surface. Selection of specific surfaces is determined by process requirements. The circular head 20 is used to distribute pressure gradient 24 across wafer 14 when the wafers are bonded. This action squeezes out any possible bubbles or voids that might occur during bonding. Vacuum shaft 16 extends from the middle of vacuum head 20. Vacuum shaft 16 further contains a vacuum port 26 which extends through vacuum shaft 16 and head 20. It should be understood that vacuum shaft 16 is connected to a rotational means which can rotate head 10 and wafer 14 at high RPM. Vacuum port 26 transfers a negative pressure to wafer 14 to hold the wafer in place for subsequent processing. In one embodiment, vacuum port 26 can also serve as a pressure inlet for creating a pressure gradient 24. Additionally, it should be further understood that chuck 10 is attached to an apparatus that possesses the freedom of movement so that direction, speed, and force can be specified.

Convex pressure gradient 24 is illustrated by a multiplicity of arrows 24 shown in chuck 10. Larger and smaller arrows illustrate the relative magnitude of pressure gradient 24 that is transferred to wafer 14 on chuck 10. Larger arrows indicate a greater pressure with smaller arrows indicating less pressure, thus a greater pressure is shown in the middle of wafer 14 with gradual diminution of pressure to the outside edges. Pressure gradient 24 is provided by a head 20 which is attached to shaft 16.

FIG. 2 pictorially illustrates one embodiment of the polishing or scrubbing operation of the present invention. Driving means 19 rotates a double sided scrubbing pad 23 so that any selected rotational speed or rotational direction can be obtained for pad 23. In this embodiment pad 23 is capable of being swung away from chuck 11 and chuck 10 for subsequent processing. A multiplicity of pads with a variety of surfaces is capable of being swung in and out from between chuck 11 and chuck 10. This variety of surfaces offers process capability from polishing, scrubbing, planarizing, or the like. Chuck 11, wafer 13, wafer 14, and chuck 10 are symmetrically aligned to center points such that wafer 13, wafer 14 and chuck 10 are hidden from view. Additionally, chuck 11 and wafer 13 are on one side of scrubbing pad 23, and chuck 10 and wafer 14 are on the other side of pad 23. Wafer chuck 11 is shown only partially contacting scrub pad 23. It should be understood by someone skilled in the art that this is only one configuration and that it would be possible to have wafer 13 in total contact with pad 23. Vacuum shaft 17 is shown with vacuum port 12. It should be understood that vacuum shaft 17 can provide a rotational means for chuck 11 that is separate and independent from rotational means 19. Rotation of shaft 17 and shaft 16 can also be left to idle or free wheel if desired. It will also be understood that chuck 11 and chuck 10 are symmetrical and can be independent from each other. It should be further understood that the mechanical attributes of chuck 11 can be applied to chuck 10 on the opposite side of pad 23. Dispense nozzle 21 is shown so that ultra pure deionized water or other materials can be dispensed while scrubbing of wafer 13 and wafer 14 is in progress. Dispensing of deionized water onto wafer 13, wafer 14, and pad 23 serves to cleanse wafer 13, wafer 14 and pad 23 free of contamination.

In yet another embodiment, wafer 14 and wafer 13 are scrubbed on the same side of pad 23.

Once the scrubbing of wafer 13 and wafer 14 is completed, polished, contamination free wafers are produced. Wafer 13 and wafer 14 are then spin dried to remove excess moisture. Spin drying is achieved by rotating wafer 13 and wafer 14 at high RPM. To enhance the spin drying process an ultra pure gas such as nitrogen or the like, can be blown on the polished surfaces.

Determination of crystal orientation of wafer 13 and wafer 14 is accomplished by observation of major and minor flats of wafer 13 and wafer 14. The identification of the major and minor flats is well known in the art and commercial equipment for doing this procedure is readily available. Knowing the orientation of wafer 13 and wafer 14 allows for the proper placement of wafer 13 and wafer 14 for bonding purposes.

After scrubbing, spin drying, and crystal orientation wafer 13 and wafer 14 are joined by moving flat wafer chuck 11 and convex pressure gradient chuck 10 together until wafer 13 and wafer 14 are in contact with each other thereby pressing the two scrubbed wafers together. The pressing of these wafers together is further enhanced by the use of pressure gradient 24 of chuck 10. Convex pressure gradient chuck 10 (see FIG. 1) causes a greater bonding force to be applied at the center of the wafers and radiate out to the periphery of the wafer thereby forcing any air or contaminants out from the bonding surfaces on the wafers.

Preferably, the wafers are bonded or pressed together immediately following the drying step; however, some delay may be permissible between drying and pressing. If the delay results in the recontamination the wafers, polishing will have to be repeated unless other steps have been taken to protect the surfaces of the wafers from contaminants.

It should be understood that in some applications the joining of surfaces that are clean and have some amount of liquid still on the surfaces to be joined is advantageous. Amounts of liquid may range from at least one monolayer to having the surface flooded with liquid. Excess liquid that is between the bonding surfaces is then squeezed out by convex pressure gradient 24 as the bonding surfaces are pressed together producing a void free bond.

In the preferred embodiment of this invention the scrubbing, spin drying, crystal orientation and joining are accomplished in one enclosure in a continuous operation.

FIG. 3 is a cross-sectional view of a portion of FIG. 2. Chuck 11 and chuck 10 squeeze wafer 13 and wafer 14 respectively up against scrub pads 23 from opposite sides. The squeezing force is generated by applying a force on chuck 11 and chuck 10 perpendicular to scrub pad 23. Wafer 13 and wafer 14 are held firmly on head 20 and head 15 by applying a negative pressure though vacuum port 12 and vacuum port 26. In another embodiment wafers are held firmly in place by frictional forces. Scrub pads 23 are supported by a flat disc 22 which is attached to rotating means 19 illustrated in FIG. 2. Pad 23 is preferably a synthetic suede leather material. One such material is Corfam (a trade name used by Dupont).

FIG. 4 is a cross-sectional view of one embodiment of a convex pressure gradient chuck 10. It should be understood that this is just one embodiment and other embodiments can be used to achieve a convex pressure gradient 24 shown in FIG. 1. Convex pressure gradient chuck 10 is a symmetrical device, therefore only one half of convex pressure gradient chuck 10 is described in detail since the other half is a mirror image. Vacuum port 26 is located in convex pressure gradient shaft 16. Vacuum port 26 is not only used to provide vacuum to hold wafer 14 to convex pressure gradient chuck 10 but, also to provide a means to input pressure so as to create a pressure gradient. Pressure supplied though port 26 can either be a liquid or a gas. Use of either a gas or a liquid is determined by processing conditions. Pressure supplied though port 26 is directed between orifice 39 and orifice 34. Orifice 39 transfers pressure from port 26 to wafer 14 though channels 38. This is the highest pressure position and is centered on wafer 14. Channels 38 are concentric grooves and receive pressure from orifice 39. Channels 38 are connected to orifice 39 by a slot (not shown). Concentric channels 38 may recieve pressure from two or more orifices 39.

Pressure reduction orifice 34 reduces pressure from incoming port 26. Plenum 33 receives reduced pressure from pressure reduction orifice 34. Pressure in plenum 33 is directed between orifice 36 and orifice 41. Orifice 36 transfers pressure from plenum 33 to channels 37. Channels 37 then direct pressure to wafer 14. This is the second highest pressure position on wafer 14. Pressure from plenum 33 is further reduced by pressure reduction orifice 41. Orifice 41 provides pressure for plenum 42 which is directed between orifice 43 and orifice 46. Pressure from plenum 42 is directed toward wafer 14 by orifice 43. Pressure coming from orifice 43 is directed into channels 44. These channels apply pressure to wafer 14. This is the third highest pressure position on wafer 14. Pressure from plenum 42 is directed into pressure reduction orifice 46. Pressure reduction orifice 46 further reduces pressure from plenum 42 into plenum 47. Pressure in plenum 47 is directed between orifice 48 and orifice 51. Pressure from plenum 47 is directed into orifice 48 which transfers pressure to channels 49. Channels 49 subsequently transfer pressure to wafer 14. This is the fourth highest pressure position on wafer 14. Orifices 34, 39, 41, and 46 provide for a gradual decrease in pressure, with a greater pressure centrally located on wafer 14 and gradually decreasing to the periphery of chuck head 20. This decline in pressure is pictorially illustrated by convex pressure gradient 24 in FIG. 1. Pressure from plenum 47 is also directed through orifice 51. Pressure coming though orifice 51 comes up against flexible flap 32. Flexible flap 32 is held in place by at least one screw or pin 31. Flexible flap 32 is made in such a manner that when excess pressure is pressed up against flap 32, flap 32 flexes as shown in phantom by lines 30. Movement by flap 32 can expel excess pressure either in a gaseous or a liquid form. Once excess pressure has been released flap 32 then resumes its normal shape. Once flap 32 is in its normal position a vacuum can be drawn though all plenums, orifices, and channels.

Channels 37, 38, 44, and 49 are formed as grooves of concentric rings around convex pressure gradient chuck. Grooves 37 are interconnected to orifice 36 by a slot (not shown) cut between the two grooves and though orifice 36. Grooves 37 may recieve pressure from two or more orifices By way of example, grooves 38, 44, and 49 are interconnected to their respective orifices in a similar manner as grooves 37. It should be understood that it is possible to have as many plenums and orifices as necessary to accommodate any wafer size. It should be further understood that convex pressure gradient chuck 10 can be manufactured from a variety of materials such as metal, rubber, or the like.

By now, it should be appreciated that there has been provided a novel apparatus and method for bonding wafers that eliminates voids and bonding defects between the bonded wafers.

We claim:

1. A method for bonding a first and a second semiconductor wafer together, which comprises:
   mounting the first semiconductor wafer on a flat chuck and mounting the second semiconductor wafer on a convex pressure gradient chuck;
   scrubbing a surface of the first and the second semiconductor wafer to obtain polished surfaces; and
   pressing the polished surfaces of the first and second semiconductor wafers together by using the flat chuck and the convex pressure gradient chuck to press them together by applying a convex pressure gradient by using pressurized fluid across a surface of the second semiconductor wafer that is in contact with the convex pressure gradient chuck, thereby applying a greater pressure centrally located which gradually decreases to a periphery of the convex pressure gradient chuck by interconnecting a series of pressure reduction orifices, plenums, and channels which create a convex pressure gradient on the second semiconductor wafer during the pressing of the polished surfaces together.

2. The method of claim 1 further including spin-drying the semiconductor wafers after the scrubbing step.

3. The method of claim 1 further including providing the convex pressure gradient chuck with a soft malleable head.

4. The method of claim 2 further including accomplishing all steps sequentially.

5. A method of bonding a first and a second semiconductor wafer together, comprising:
   polishing a surface of the first semiconductor and a surface of the second semiconductor wafer to obtain clean surfaces;
   pressing the clean surfaces of the first and the second semiconductor wafer together by applying a convex pressure gradient across at least a surface opposite the clean surface of the first semiconductor wafer; and
   creating the convex pressure gradient by using a pressurized fluid through orifices and channels to create a greater pressure centrally located which gradually decreases to a periphery of the convex pressure gradient chuck to bond the first and second semiconductor wafers together.

6. A method for bonding a first and a second semiconductor wafer together which comprises the steps of:
   scrubbing a surface of the first semiconductor wafer and a surface of the second semiconductor wafer to obtain clean surfaces;
   spin drying the surface of the first and the second semiconductor wafer to obtain at least a monolayer of liquid left on the surface of at least one wafer;
   pressing the surface of the first and the second semiconductor wafer together by exerting a convex pressure gradient on at least the first semiconductor wafer; and
   creating the convex pressure gradient by using a pressurized fluid through orifices and channels to create a greater pressure centrally located which gradually decreases to a periphery of the convex pressure gradient chuck to bond the first and second semiconductor wafers together.

* * * * *